United States Patent
Park et al.

(10) Patent No.: US 12,324,253 B1
(45) Date of Patent: Jun. 3, 2025

(54) LIGHT-GATED TRANSISTOR INCLUDING LARGE-AREA TRANSITION METAL DICHALCOGENIDE AS LIGHT SENSING LAYER AND METHOD OF MANUFACTURING THE SAME

(71) Applicant: INDUSTRY-ACADEMIC COOPERATION FOUNDATION GYEONGSANG NATIONAL UNIVERSITY, Jinju-si (KR)

(72) Inventors: Jun Hong Park, Jinju-si Gyeongsangnam-do (KR); Hyeong Tae Kim, Changwon-si (KR); Do Hyeon Lee, Jinju-si (KR)

(73) Assignee: INDUSTRY-ACADEMIC COOPERATION FOUNDATION GYEONGSANG NATIONAL UNIVERSITY, Jinju-si (KR)

( * ) Notice: Subject to any disclaimer, the term of this patent is extended or adjusted under 35 U.S.C. 154(b) by 0 days.

(21) Appl. No.: 19/027,217

(22) Filed: Jan. 17, 2025

(30) Foreign Application Priority Data

Mar. 7, 2024 (KR) ........................ 10-2024-0032547

(51) Int. Cl.
*H10F 30/282* (2025.01)
*H03K 19/20* (2006.01)
(Continued)

(52) U.S. Cl.
CPC ........... *H10F 30/282* (2025.01); *H10F 71/00* (2025.01); *H10F 77/12* (2025.01); *H03K 19/20* (2013.01)

(58) Field of Classification Search
CPC ........ H10F 30/282; H10F 71/00; H10F 77/12; H03K 19/20; H01L 21/0262; H01L 31/0256; H01L 31/032; H01L 31/18; H01L 31/10; H01L 31/112; H01L 31/1126; H01L 31/1129; H01L 31/1136
See application file for complete search history.

(56) References Cited

U.S. PATENT DOCUMENTS

| 2024/0063296 A1* | 2/2024 | Zhang | ................. H10D 62/117 |
| 2024/0063299 A1* | 2/2024 | Zhang | ................. H10D 62/118 |

(Continued)

FOREIGN PATENT DOCUMENTS

| CN | 110241400 A | * | 9/2019 | |
| CN | 111304738 B | * | 6/2021 | ........... C23C 16/305 |

(Continued)

OTHER PUBLICATIONS

Siqi Yin et al., "Basic Logic Operations Achieved in a Single 2D WSe2 Transistor by Surface-Charge-Transfer Doping", ACS Appl. Electron. Mater.2021, 3: 5059-506.

*Primary Examiner* — Earl N Taylor
(74) *Attorney, Agent, or Firm* — Bridgeway IP Law Group, PLLC; Jihun Kim

(57) ABSTRACT

A transition metal chalcogenide flake manufactured by the molten salt-assisted thermal chemical vapor deposition method according to a preferred embodiment can be uniformly and evenly grown on a large-area substrate with a size of several to several hundred micrometers in scale, and a light-gated transistor using this as a light sensing layer can perform logical operations of AND, OR, and summation operations in response to light stimulation and enable a low-power synaptic operation response.

5 Claims, 17 Drawing Sheets

(51) Int. Cl.
    *H10F 71/00*         (2025.01)
    *H10F 77/12*         (2025.01)

(56) References Cited

U.S. PATENT DOCUMENTS

| | | | |
|---|---|---|---|
| 2024/0071759 A1* | 2/2024 | Kim | H01L 21/02639 |
| 2024/0102196 A1* | 3/2024 | Zheng | H01L 21/3063 |
| 2024/0263349 A1* | 8/2024 | Zhang | C30B 25/16 |

FOREIGN PATENT DOCUMENTS

| | | | | | |
|---|---|---|---|---|---|
| CN | 113621939 | A | * | 11/2021 | |
| CN | 115241307 | A | * | 10/2022 | H01L 31/0336 |
| CN | 115579405 | A | * | 1/2023 | |
| CN | 115305563 | B | * | 9/2023 | |
| CN | 116926677 | A | | 10/2023 | |
| CN | 117512558 | A | * | 2/2024 | |
| CN | 117551980 | A | * | 2/2024 | |
| CN | 115241307 | B | * | 5/2024 | H01L 31/0336 |
| CN | 118431333 | A | * | 8/2024 | |
| KR | 10-2022-0155699 | A | | 11/2022 | |
| WO | WO-2020130935 | A1 | * | 6/2020 | |
| WO | WO-2020248244 | A1 | * | 12/2020 | |
| WO | WO-2021015677 | A1 | * | 1/2021 | H01L 21/443 |
| WO | WO-2023193637 | A1 | * | 10/2023 | |

\* cited by examiner

LIGHT-GATED TRANSISTOR INCLUDING LARGE-AREA TRANSITION METAL DICHALCOGENIDE AS LIGHT SENSING LAYER AND METHOD OF MANUFACTURING THE SAME

CROSS REFERENCE TO RELATED APPLICATION

The present application claims priority to Korean Patent Application No. 10-2024-0032547, filed Mar. 7, 2024, in the Korean Intellectual Property Office, the entire contents of which is incorporated herein for all purposes by this reference.

BACKGROUND OF THE INVENTION

Field of the Invention

The present invention relates to a light-gated device, and more specifically, to a light-gated transistor (LGT) including a transition metal chalcogenide (TMD) as a light sensing layer and a method of manufacturing the same.

Description of the Related Art

Autonomous driving began to be studied in the 1970s, and with the emergence of deep learning technology in the 2010s, the technology has been rapid advanced, and autonomous driving-related technologies are advancing even faster through the COVID-19 era. In order to respond to 'artificial intelligence' and 'safety,' which are the core technologies of the future smart mobility industry, the sensing device technology that recognizes lanes and obstacles in front of a vehicle and the artificial neural network processing device, which are equipped with the neuromorphic technology that performs cognition-perception-computation information processing simultaneously and in parallel, like the neuron structure and operation of the human brain, to perform ultra-high-speed information processing such as cognition/judgment/control/computation, are gaining more importance.

SUMMARY OF THE INVENTION

The present invention has been conceived to solve the above-described problem, and can provide a light-gated transistor (LGT) including a light sensing layer capable of responding to light stimulation and exhibiting neuromorphic characteristics, and a method of manufacturing the same.

To solve the above-described problem, the method of manufacturing an LGT according to a preferred embodiment of the present invention includes: a step of preparing a first heating furnace and a second heating furnace spaced apart from each other in a same space; a step of positioning a first precursor including a chalcogen material in the first heating furnace, a second precursor prepared by mixing a transition metal oxide and a metal halide salt in the second heating furnace, and a substrate to be adjacent to the second precursor; a step of forming a light sensing layer including at least one transition metal dichalcogenide (TMD) flake on top of the substrate by heating each of the first heating furnace and the second heating furnace to different temperatures and performing molten salt-assisted thermal chemical vapor deposition; and a step of depositing an electrode to form at least two junctions in the light sensing layer.

The mixing ratio of the transition metal oxide and the metal halide salt may be 4:1 to 8:1 by weight.

The metal halide salt may be represented by the chemical formula $AZ$ or $AZ_2$, and the A may be an alkali metal or alkaline earth metal, and the Z may be a halogen element.

The metal halide salt may include at least one selected from NaCl, NaBr, KCl, KBr, LiCl, LiBr, $CaCl_2$, $MgCl_2$, $CaB_2$, $MgBr_2$, and a combination thereof.

In the step of forming the light sensing layer, the temperature of the first heating furnace may be higher than or equal to 500° C. and lower than 700° C., and the temperature of the second heating furnace may be higher than or equal to 700° C. and lower than 900° C.

The TMD flake may have a layered form of a single layer or two or more layers.

The average horizontal length of the transition metal dichalcogenide flake included in the light sensing layer may be 10 to 100 m.

The electrode may include a metal or a metal compound, and the metal or metal compound may include a metal element including at least one selected from Ti, Ni, Au, Ag, and a combination thereof.

To solve the above-described problem, the LGT according to a preferred embodiment of the present invention includes: a light sensing layer provided on top of a substrate and including at least one TMD flake; and a plurality of electrodes provided on the light sensing layer and spaced apart from each other.

The transistor may be a logic element that derives current characteristics according to the change of at least one of optical power applied from the outside in the form of a pulse and voltage applied to a gate electrode and performs AND, OR, and summation logical operations based on the derived current characteristics.

The transistor may be an artificial synaptic transistor having synaptic characteristics of deriving current characteristics according to the change of at least one of optical power applied from the outside in the form of a pulse and voltage applied to a gate electrode and electrically simulating synaptic response of a neuron based on the derived current characteristics.

The synaptic response of the neuron may include learning (potentiation) and forgetting (depression) responses due to light stimulation applied in the form of a pulse.

The transition metal dichalcogenide flake may have a layered form of a single layer or two or more layers.

The average horizontal length of the TMD flake included in the light sensing layer is 10 to 100 μm.

The electrode may include a metal or a metal compound, and the metal or metal compound may include a metal element including at least one selected from Ti, Ni, Au, Ag, and a combination thereof.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF THE EMBODIMENTS

Figure 1:
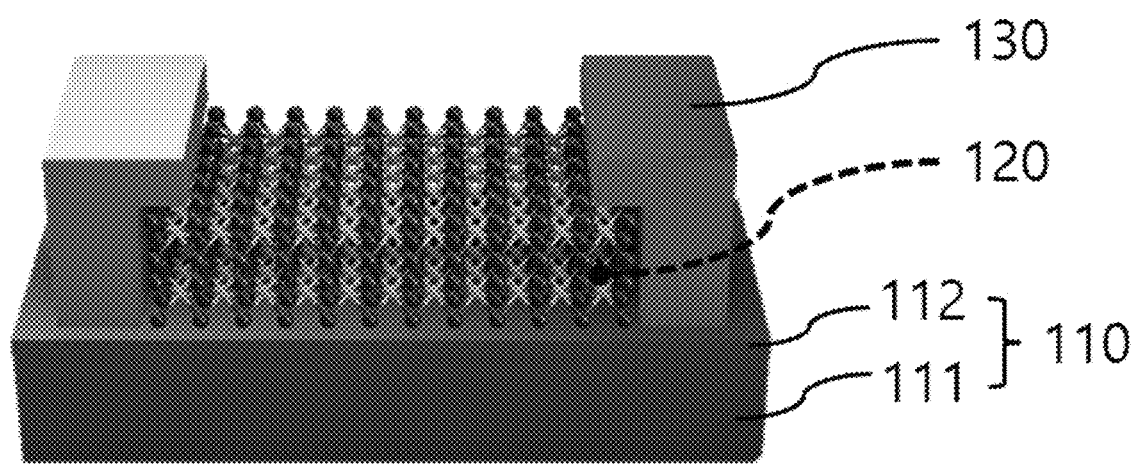
FIG. 1 shows a schematic diagram illustrating a cross-section of a light-gated transistor (LGT) according to one embodiment of the present invention.

Hereinafter, preferred embodiments of the present invention will be described in detail with reference to the accompanying drawings. The advantages and features of the present invention and methods for achieving them will become apparent with reference to the embodiments described in detail below together with the accompanying drawings. However, the present invention is not limited to the embodiments disclosed below, but may be implemented in various different forms, and the present embodiments are provided only to make the disclosure of the present invention complete and to fully inform those skilled in the art of the scope of the invention, and the present invention is defined only by the scope of the claims. The same reference numerals refer to the same elements throughout the specification.

Unless otherwise defined, all terms (including technical and scientific terms) used herein may be used as the same meaning as generally understood by one of ordinary skill in the art to which the present invention pertains. In addition, terms defined in commonly used dictionaries are not interpreted in an idealized or overly formal sense unless clearly so defined in the present invention. The terminology used herein is for the purpose of describing embodiments only and is not intended to limit the present invention. Singular forms used herein include plural forms, unless the context clearly indicates otherwise.

"Comprise" and/or "comprising" used herein specify(ies) the presence of mentioned components, steps, operations, and/or devices do(es) not preclude the possibility of the presence or addition of one or more other components, steps, operations, and/or devices.

Light-Gated Transistor Including Transition Metal Dichalcogenide as Light Sensing Layer FIG. 1 shows a schematic diagram illustrating a cross-section of an LGT according to one embodiment of the present invention.

Referring to FIG. 1, a light-gated transistor (LTG) 100 may include a light sensing layer 120 provided on a substrate 110 and including a two-dimensional semiconductor material; and a plurality of electrodes 130 provided on the light sensing layer 120 and spaced apart from each other.

The substrate 110 is made of a semiconductor material, and a semiconductor substrate such as silicon or silicon-on-insulator (SOI) may be used, and specifically, a silicon substrate 111 having a dielectric layer 112 formed on a surface having a thickness of several to several hundred nanometers may be used. In addition, a wide bandgap semiconductor substrate such as silicon carbide (SiC), gallium nitride (GaN), or gallium oxide ($Ga_2O_3$) may be used. A substrate 110 further doped with a dopant may also be used.

The light sensing layer 120 is a layer that responses to an electrical change generated when an optical signal is applied, and may include a two-dimensional semiconductor material. The light sensing layer 120 may be easily used as a light sensing layer of an LGT capable of responding to an optical signal including near-infrared, visible light, or ultraviolet wavelengths.

Specifically, a two-dimensional (2D) semiconductor material may have a structure in which strong covalent bonds are formed within a single layer and layers are bonded with a relatively small van der Waals force. Unlike general optoelectronic devices, the 2D semiconductor material may be used as a light sensing layer of an optoelectronic device using only a single material by utilizing its direct transition properties, so that there is the advantage that the device structure is simple.

The 2D semiconductor material may be provided in a plate-shaped sheet having a layered structure within the light sensing layer 120, for example, in a flake form, and may be a monolayer or a multilayer of two or more layers. The above 2D semiconductor material exhibits indirect transition characteristics in bulk or thin film state of normal thickness, but exhibits direct transition characteristics when the thickness is within the thickness of a single layer or several layers, and has excellent light responsivity and transparent and flexible characteristics, so that it can be effectively applied as an optoelectronic device.

In addition, the 2D semiconductor material has a layered structure in which each layer maintains a very strong covalent bond between the constituent atoms, and individual layers are bonded by a weak van der Waals force. Since there is no dangling bond extending out of the layer, and in principle, only 2D interactions with the constituent atoms occur, carrier transport exhibits a ballistic transport pattern, unlike conventional thin films or bulk materials, and thus the 2D semiconductor material can be applied as a high-mobility, high-speed, low-power semiconductor.

Furthermore, the 2D semiconductor material has the advantage of being capable of exhibiting a sensitive photoelectric response even to a trace amount of optical stimulation due to its thin layered structure at the atomic scale, so that it can exhibit a learning ability with increased conductivity and a forgetting characteristic by electrical stimulation by sensitively responding to optical stimulation even in the form of a pulse.

The 2D semiconductor material may include a TMD. Specifically, the TMD may be represented by the chemical formula $MX_2$, and here M is a transition metal element, such as Mo, W, Nb, V, Ta, Ti, Zr, Hf, Tc, Re, Ru, Co, Pd, Pt, Cu, Ga, In, Sn, Ge, Pb or at least one selected from a combination thereof, and X is a chalcogen element and may include at least one selected from S, Se, Te, or a combination thereof. Specifically, the TMD material may include at least one selected from $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, $PdTe_2$ or a combination thereof. More specifically, the TMD material may include at least one selected from $MoS_2$, $MoSe_2$, $WS_2$, $WSe_2$, or at least one selected therefrom, and in one specific example, it may include $WSe_2$, but is not limited thereto.

The crystal structure of the 2D semiconductor material may have a covalent bond between the transition metal M and the chalcogen element X, and based on this, it may have a hexagonal structure in the plane direction. It may also be possible to change the crystal structure through an additional phase change step or doping step.

In particular, when the 2D semiconductor material is provided as a TMD sheet, for example, a TMD flake, the average horizontal length thereof may be understood as a size of several to several hundred micrometers in scale, for example, a TMD microflake. Specifically, the average horizontal length of the TMD flake may be 10 to 100 m, and in one specific example, 50 to 60 m, but is not limited thereto.

The electrode 130 may include a metal or a metal compound. The metal or metal compound may include a metal element including at least one selected from Ti, Ni, Au, Ag, and a combination thereof, and any type may be used without limitation as long as it includes a type of metal element suitable for application as an electronic device such as a metal electrode or metal interconnection.

Method for Manufacturing TMD Flake

Figure 2:
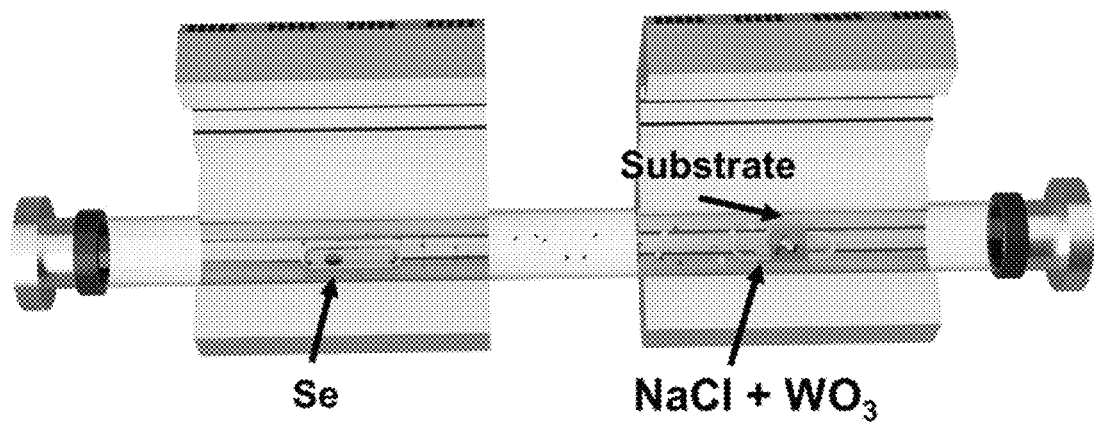
FIG. 2 shows a schematic diagram illustrating a heating furnace used in the manufacture of a transition metal chalcogenide (TMD) sheet using a molten salt-assisted thermal chemical vapor deposition (CVD) method according to one embodiment of the present invention.

FIG. 2 shows a schematic diagram illustrating a heating furnace used in the manufacture of a TMD flake using a molten salt-assisted thermal CVD method according to one embodiment of the present invention.

Referring to FIG. 2, in the manufacture of a TMD flake using the salt-assisted thermal CVD method according to one embodiment of the present invention, the TMD flake being used as the light sensing layer of an LGT, a step of preparing a first heating furnace and a second heating furnace that are spaced apart from each other in the same space may be performed. The first heating furnace and the second heating furnace may be connected by a single quartz tube, and a carrier gas may be allowed to flow through both ends.

Next, a first precursor including a chalcogen material may be positioned in the first heating furnace.

The first precursor may include at least one selected from the group consisting of a chalcogen material, for example, S, Se, Te, or a combination thereof. In one specific example, the first precursor may be Se, but is not limited thereto.

In addition, a second precursor may be positioned within the second heating furnace so as to be spaced apart from the first precursor by a predetermined distance, and a substrate may be positioned adjacent to the second precursor.

The second precursor may be positioned in the same space as the first precursor and spaced apart by a predetermined distance, and the spacing may be a distance at which the precursors may be volatilized and transported in a vapor state within the heating furnace, and may be specifically 1 to 100 cm, more specifically 10 to 70 cm or 20 to 60 cm, and in one specific example, 20 to 40 cm, but is not limited thereto.

The second precursor may be a mixture including the transition metal oxide and the metal halide salt.

The transition metal oxide may be a compound in which the transition metal M represented in the above-described TMD material (chemical formula $MX_2$) and an oxygen atom are bonded, and may have, for example, a chemical formula $M_xO_y$ (wherein x and y are integers). Specifically, the transition metal oxide may refer to an oxide of Mo, W, Nb, V, Ta, Ti, Zr, Hf, Tc, Re, Ru, Co, Pd, Pt, Cu, Ga, In, Sn, Ge, Pb or at least one selected from these. For example, the transition metal oxide may include MoO, $MoO_2$, $MoO_3$, $MoO_x$, $Mo_2O_3$, $Mo_2O_5$, WO, $WO_2$, $WO_3$, $WO_x$, $W_2O_3$, $W_2O_5$, $W_{18}O_{49}$, $W_{20}O_{58}$, $W_{24}O_{70}$, $W_{25}O_{73}$, $W_{40}O_{118}$, NbO, $NbO_2$, $Nb_2O_3$, $Nb_2O_5$, VO, $VO_2$, $V_2O_3$, $V_2O_5$, $Ta_2O$, $Ta_2O_5$, $TiO_2$, ZrO, $ZrO_2$, $Zr_2O_3$, $Zr_2O_5$, $HfO_2$, $Hf_2O_3$, $Hf_2O_5$, and the like. In one specific example, the transition metal oxide may be $WO_3$, but is not limited thereto.

The metal halide salt may serve as a catalyst that catalyzes the synthesis of the precursor, and by controlling the ratio of the precursor mixed with the metal halide salt, the shape and quality of the grown material, specifically, the nucleus density, crystal size, shape, homogeneity, and the like may be controlled. Specifically, the metal halide salt can improve the reaction kinetics of the material to be synthesized through an increase in vapor pressure when applied to the thermal CVD method. More specifically, the metal halide salt may react with the transition metal oxide, thereby forming a highly volatile molten salt having a low melting point and high vapor pressure. A thermal CVD method assisted by a molten salt may be performed. Therefore, by using the salt-assisted thermal CVD method including the metal halide salt, a high-quality TMD flake can be grown at a lower pressure and temperature than a general chemical vapor deposition method including only a transition metal oxide as a precursor.

The metal halide salt may be represented by the chemical formula AZ or $AZ_2$, and here A may be an alkali metal or an alkaline earth metal, and Z may be a halogen element. For example, the metal halide salt may include at least one selected from NaCl, NaBr, KCl, KBr, LiCl, LiBr, $CaCl_2$, $MgCl_2$, $CaBr_2$, $MgBr_2$, and a combination thereof. In one specific example, the metal halide salt may be NaCl, but is not limited thereto.

The thermal CVD method using a molten salt described below, which is generated by mixing the transition metal oxide and the metal halide salt, can lower the growth temperature of the TMD by promoting the reduction of the transition metal oxide. The mixing ratio of the transition metal oxide and the metal halide salt may be a weight ratio of 4:1 to 8:1, specifically, a weight ratio of 5:1 to 7:1. When the mixing ratio is within the above-described range, the average horizontal length of the TMD flake formed by the preferred manufacturing method of the present invention may be as large as several to several tens of micrometers, and may grow to, for example, about 50 to 60 m. This may be uniform growth to a larger size than a growth method in which mixing of the metal halide salt is not performed. However, when the mixing ratio of the metal halide salt to the transition metal oxide increases beyond the above-described range, the size of the formed TMD flake may decrease. In one specific example, the mixing ratio of the transition metal oxide and the metal halide salt may be a weight ratio of 6:1, but is not limited thereto.

Next, a step of forming a light sensing layer including a TMD flake on top of the substrate by heating each of the first heating furnace and the second heating furnace to different temperatures and performing molten salt-assisted thermal CVD may be performed.

During the thermal CVD process, a molten salt may be formed as an intermediate material due to the reaction of the metal halide salt and the transition metal oxide. The molten salt may lower the growth temperature of the TMD by promoting the reduction of the transition metal oxide. The molten salt formed at this time may have a form of chemical formula $A_aMbO_c$ (wherein a, b, and c are integers). The molten salt may be completely reacted and removed as an intermediate material, and may be a material that does not remain after the growth of the TMD flakes is completed as a final material. When the assistance by the molten salt is not performed, the synthesis of the TMD may not be performed smoothly. The mechanism by which the above-described TMD flake is formed through the thermal CVD method assisted by the molten salt may be explained, for example, according to Schemes 1 to 3 below.

$2WO_{3(s)} + 2NaCl_{(s)} \rightarrow WO_2Cl_{2(g)} + Na_2WO_{4(l)}$     [Scheme 1]

$Na_2WO_{4(l)} + 2H_2Se_{(g)} + H_{2(g)} \rightarrow WSe_{2(s)} + 3H_2O_{(g)} + Na_2O_{(s)}$     [Scheme 2]

$WO_2Cl_{2(ads)} + 2H2Se_{(ads)} + H_{2(g)} \rightarrow WSe_{2(s)} + 2H_2O_{(g)} + 2HCl_{(g)}$     [Scheme 3]

First, NaCl, which is a metal halide salt, may react with $WO_3$ a transition metal oxide, to form $WO_2Cl_2$ in a gaseous state, and at the same time, may form $Na_2WO_4$ as a molten salt having a low melting point and high vapor pressure. Molten $Na_2WO_4$ is a material with strong volatility, and may react with $H_2Se$, which is chalcogen vapor saturated in a gaseous state in a furnace, to form $WSe_2$ as a TMD. In addition, $WSe_2$ may also be formed due to a reaction with $WO_2Cl_2$ and $H_2Se$. By including the metal halide salt, high-quality TMD flake may be grown more quickly at a lower pressure and temperature than those of a CVD method that only includes a transition metal oxide as a precursor.

In addition, in the thermal CVD process, the growth temperature is a factor that may govern the deposition process, crystal nucleation, and the growth rate of the material, directly affect the kinetics of the synthesized material, and change the coverage of the thin film layer. The heating temperature of the first furnace, in which the first precursor including the chalcogen material is positioned, may be higher than or equal to 500° C. and lower than 700° C., and in one specific example, may be 600° C., but is not limited thereto. In addition, the temperature of the second furnace, in which the second precursor including the mixture of the transition metal oxide and the metal halide salt is positioned, may be higher than or equal to 700° C. and lower than 900° C., and in one specific example, may be 800° C., but is not limited thereto.

The TMD flakes formed by thermal CVD by heating the first heating furnace and the second heating furnace may be deposited on the substrate, and the deposition time is a factor that may change the coverage of the thin film layer. As the deposition time increases, the coverage of covering the substrate may increase. The deposition time may be 1 to 10 minutes, specifically 3 to 9 minutes, and more specifically 5 to 8 minutes. When the thermal CVD process is performed with a deposition time within the above-described range, it may have a coverage of 80% or more based on the area of the substrate. In one specific example, the deposition time of the thermal CVD process may be 7 minutes, and the area of the TMD flake manufactured through this may have a coverage of 90% or more based on the area of the substrate.

In particular, by using the salt-assisted thermal CVD method of the present invention, it is possible to lower the growth temperature by promoting the reduction of the transition metal oxide by the molten salt. In addition, since a TMD flake can simultaneously implement electrostatic gating through a dielectric and light gating by applying an optical signal, it has the advantage of combining different gating methods to implement AND and OR logic operations in a single device.

Next, a step of depositing an electrode to form at least two junctions in the light sensing layer may be performed.

The electrode may include a metal or a metal compound. The metal or metal compound may include a metal element including at least one selected from Ti, Ni, Au, Ag, and a combination thereof, and any type may be used without limitation as long as it includes a type of metal element suitable for application as an electronic device such as a metal electrode or metal interconnection.

In the step of depositing the electrode, a method of depositing a metal thin film in which energy at a level that does not induce defects in the light sensing layer is applied, for example, a method such as an electron beam evaporator, a thermal evaporator, or sputtering, may be used without limitation.

Hereinafter, the present invention will be described in more detail using examples and comparative examples. However, the following examples and comparative examples are for illustrative purposes, and the scope of the present invention is not limited thereto.

Manufacturing Example 1: Growth of WSe$_2$ Layer Using Salt-Assisted Thermal CVD Method A quartz boat containing 48 mg of selenium (Se, >99.5%) powder was placed in a first furnace, and a quartz boat containing a mixture of 24 mg of tungsten oxide (WO$_3$, 99.9%) powder and 4 mg of sodium chloride (NaCl, >99.0%) powder was placed in a second furnace. Meanwhile, a 2.5 cm×2.5 cm silicon wafer having a 300 nm thick SiO$_2$ insulating layer was placed in the second furnace containing WO$_3$/NaCl. The spacing between the two quartz boats was optimized to be 34 cm in the quartz tube, and the quartz tube was vacuumed to 10$^{-2}$ Torr and then Ar was introduced to flow as a carrier gas at 100 sccm. Thereafter, the first furnace and the second furnace were heated at ramp rates of 10.9° C./min and 14.5° C./min, respectively. As a result, WSe$_2$ was grown under the conditions that the temperature of the first furnace containing Se was 600° C. and the temperature of the second furnace containing WO$_3$/NaCl was 800° C. During the WSe$_2$ growth process, the Ar flow rate of 100 seem and the H$_2$ flow rate of 20 seem were maintained for seven minutes so that the gases were continuously introduced to flow. After the reaction was completed and the furnaces were cooled, a wafer substrate on which multiple layers of WSe$_2$ flake were grown was obtained using the salt-assisted thermal CVD method.

Manufacturing Example 2: Growth of WSe$_2$ Layer Using Thermal CVD Method

A wafer substrate on which WSe$_2$ flake was grown was obtained using the same method as Manufacturing Example 1, except that only tungsten oxide (WO$_3$) powder excluding sodium chloride (NaCl) was used instead of using the mixed powder of tungsten oxide (WO$_3$) powder and sodium chloride (NaCl).

Experimental Example 1: Confirmation of the Properties of TMD Flake Grown by Salt-Assisted Thermal CVD Method FIG. 3 shows (a) an optical photograph of a substrate on which the TMD flake is grown by the salt-assisted thermal CVD method according to Manufacturing Example 1 of the present invention, (b) an optical microscope image thereof, (c) a coverage (%) according to the thermal CVD time, and (d) an X-ray photoelectron spectroscopy (XPS) result of the TMD flake grown by the thermal CVD, and FIG. 4 shows (a) the results of atomic force microscopy (AFM) of the TMD flake according to Example 1 of the present invention, (c) a height profile thereof, (b) a Kelvin probe force microscope (KPFM) image thereof, and a contact potential difference (CPD) profile thereof.

Figure 3:
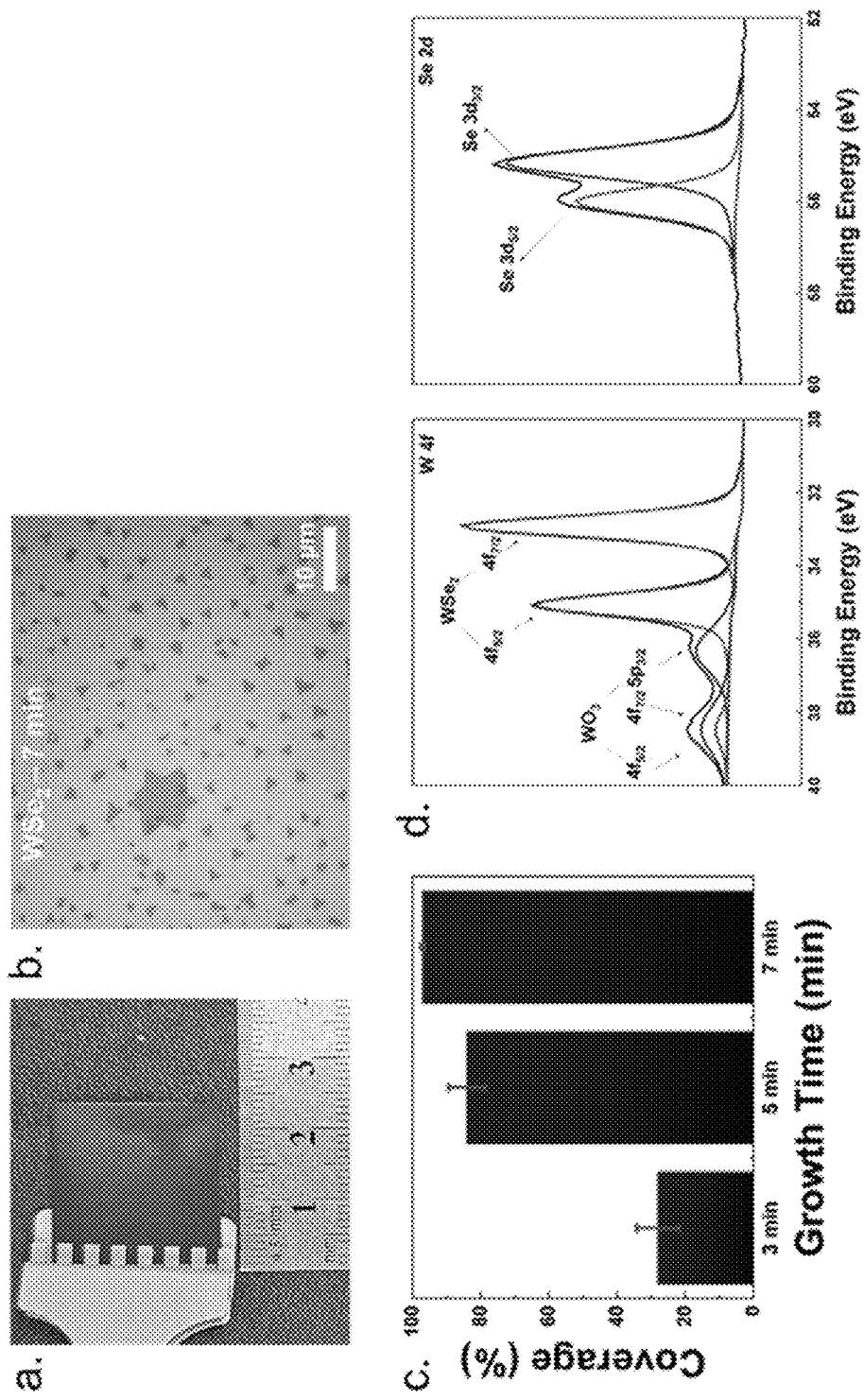
FIG. 3 shows (a) an optical photograph of a substrate on which the TMD flake is grown by the salt-assisted thermal CVD method according to Manufacturing Example 1 of the present invention, (b) an optical microscope image thereof, (c) a coverage (%) according to the thermal CVD time, and (d) an X-ray photoelectron spectroscopy (XPS) result of the TMD flake grown by the thermal CVD.
Figure 4:
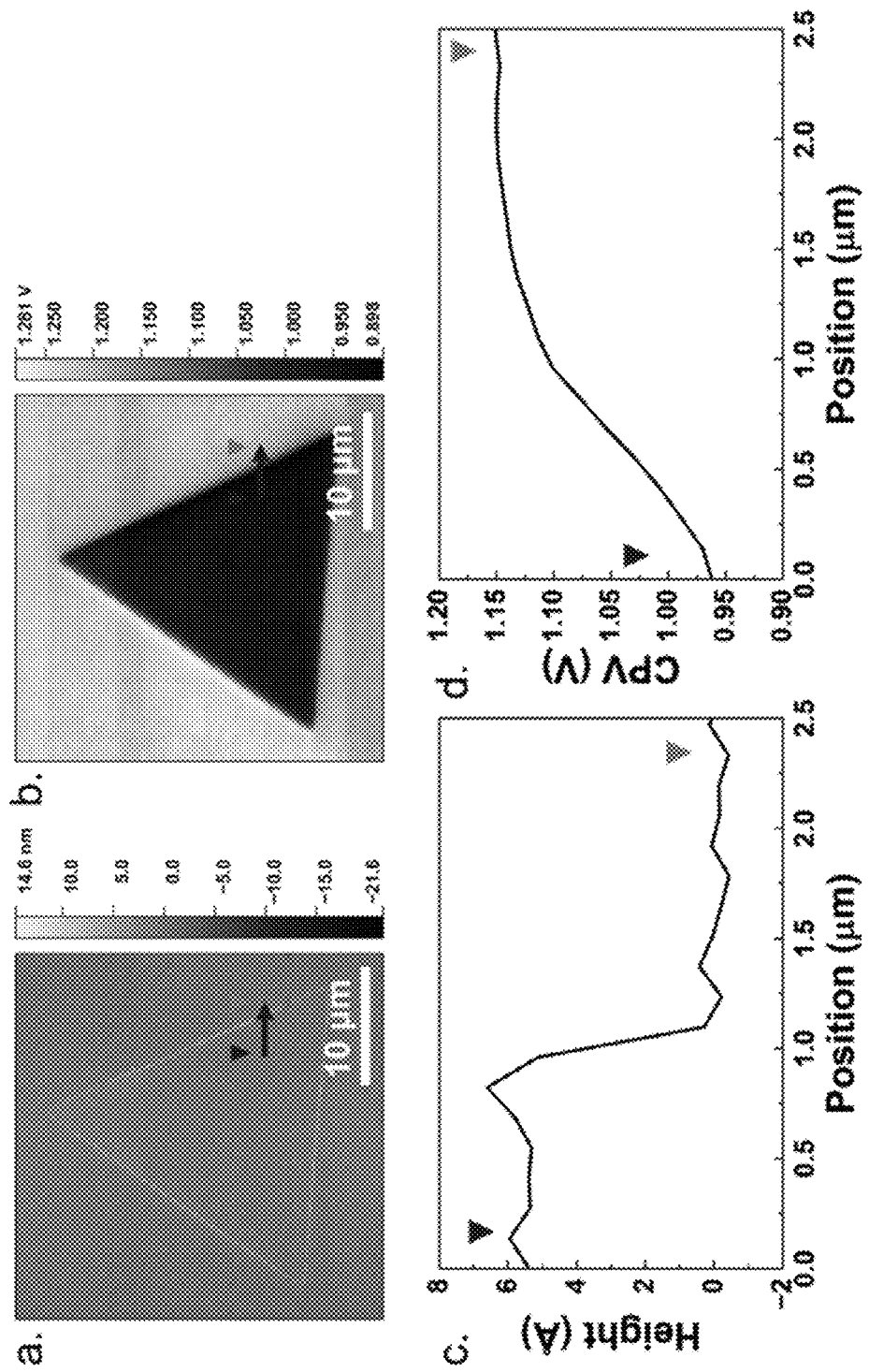
FIG. 4 shows (a) the results of atomic force microscopy (AFM) of the TMD flake according to Example 1 of the present invention, (c) a height profile thereof, (b) a Kelvin probe force microscope (KPFM) image thereof, and a contact potential difference (CPD) profile thereof.

Referring to FIGS. 3 and 4, it can be confirmed that the TMD flake synthesized by the salt-assisted thermal CVD method was uniformly grown on the SiO$_2$/Si substrate, and it can be confirmed that when the heating temperature of the second furnace having the second precursor mixed with the transition metal oxide and the metal halide salt was 800° C. and the deposition time was seven minutes, a very high coverage of approximately 95% was exhibited. These results are excellent in that the manufactured TMD material exhibited high coverage while maintaining the 2H phase. In addition, it can be confirmed that the manufactured TMD flake had a smooth surface without roughness and has a uniform thickness over the entire area of the flake. Through the profile scan, it can be confirmed that the TMD flake of a single layer has a thickness of approximately 0.7 nm. In addition, the TMD flakes consisting of two layers, three layers, and multiple layers were formed with thicknesses of 1.5 nm, 2.2 nm, and 6.5 nm, respectively. Furthermore, the work function difference between the single-layer TMD flake and the Si/SiO$_2$ substrate was approximately 0.1 V.

Figure 5:
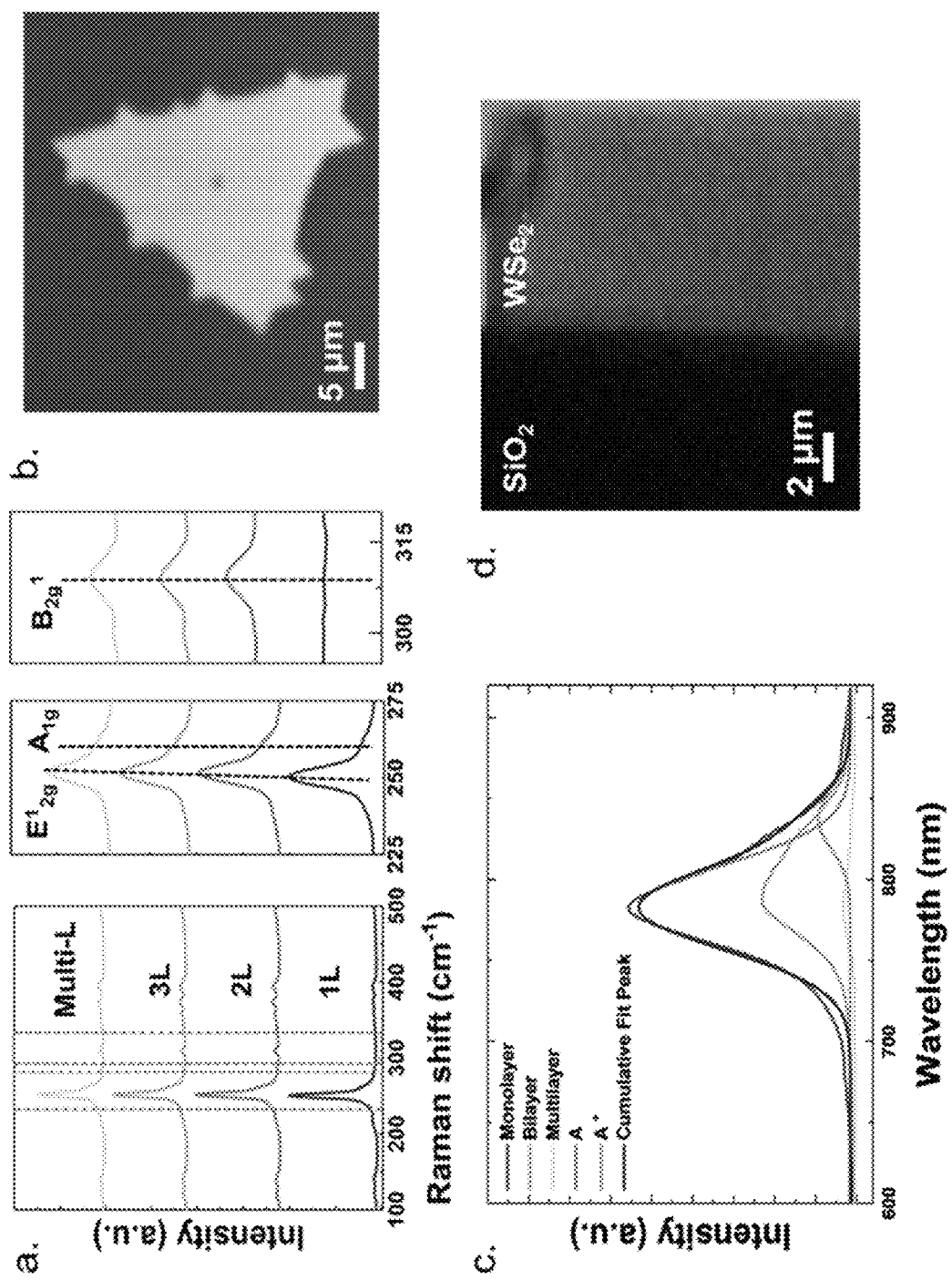
FIG. 5 shows the results of Raman analysis of (a) single-layer (1L), two-layer (2L), three-layer (3L), and multi-layer (Multi-L) TMD flake synthesized by a salt-assisted thermal CVD method according to Manufacturing Example 1 of the present invention, (b) Raman intensity mapping at the $E^1_{2g}$ vibrational mode (251 cm$^{-1}$) for a single-layer TMD flake, (c) photoluminescence (PL) spectroscopy results for TMD flakes according to the number of layers, and (d) PL intensity mapping results for a single-layer TMD flake on a $SiO_2$ substrate.

FIG. 5 shows the results of Raman analysis of (a) single-layer (1L), two-layer (2L), three-layer (3L), and multi-layer (Multi-L) TMD flake synthesized by a salt-assisted thermal CVD method according to Manufacturing Example 1 of the present invention, (b) Raman intensity mapping at the $E^1_{2g}$ vibrational mode (251 cm$^{-1}$) for a single-layer TMD flake, (c) photoluminescence (PL) spectroscopy results for TMD flakes according to the number of layers, and (d) PL intensity mapping results for a single-layer TMD flake on a SiO$_2$ substrate.

Referring to FIGS. 5A and 5B, it was confirmed through the Raman analysis that the TMD (WSe$_2$) flake synthesized by the salt-assisted thermal CVD method had a 2H-phase crystal structure. The Raman spectrum showed distinct peaks at approximately 250 cm$^{-1}$ and 260 cm$^{-1}$ corresponding to the in-plane vibration mode ($E^1_{2g}$) and the out-of-plane vibration mode ($A_{1g}$). Meanwhile, a peak was observed at approximately 304 cm$^{-1}$ in the interlayer interaction mode ($B_{2g}^1$). Through this, it can be seen that the peak at approximately 304 cm$^{-1}$ was not observed in the single-layer (denoted as 1L) sample, but was confirmed in the multilayer (denoted as 2L, 3L, and Multi-L) samples. Through the Raman intensity mapping results, it can be confirmed that in the Raman intensity map for the single-layer WSe$_2$ flake in the $E^1_{2g}$ vibrational mode (251 cm$^1$), that the Raman intensity was uniformly distributed over the entire area of the TMD flake.

Referring to FIGS. 5C and 5D, it can be confirmed through the PL results that high intensity was exhibited for the TMD monolayer (denoted as Monolayer) peak, while the intensity of the peak for the multilayer (denoted as Bilayer and Multilayer) peaks decreased as the number of layers increased. It can be confirmed that the PL mapping results for the 0.7 nm monolayer TMD (WSe$_2$) on the SiO$_2$ substrate showed uniform intensity.

Figure 6:
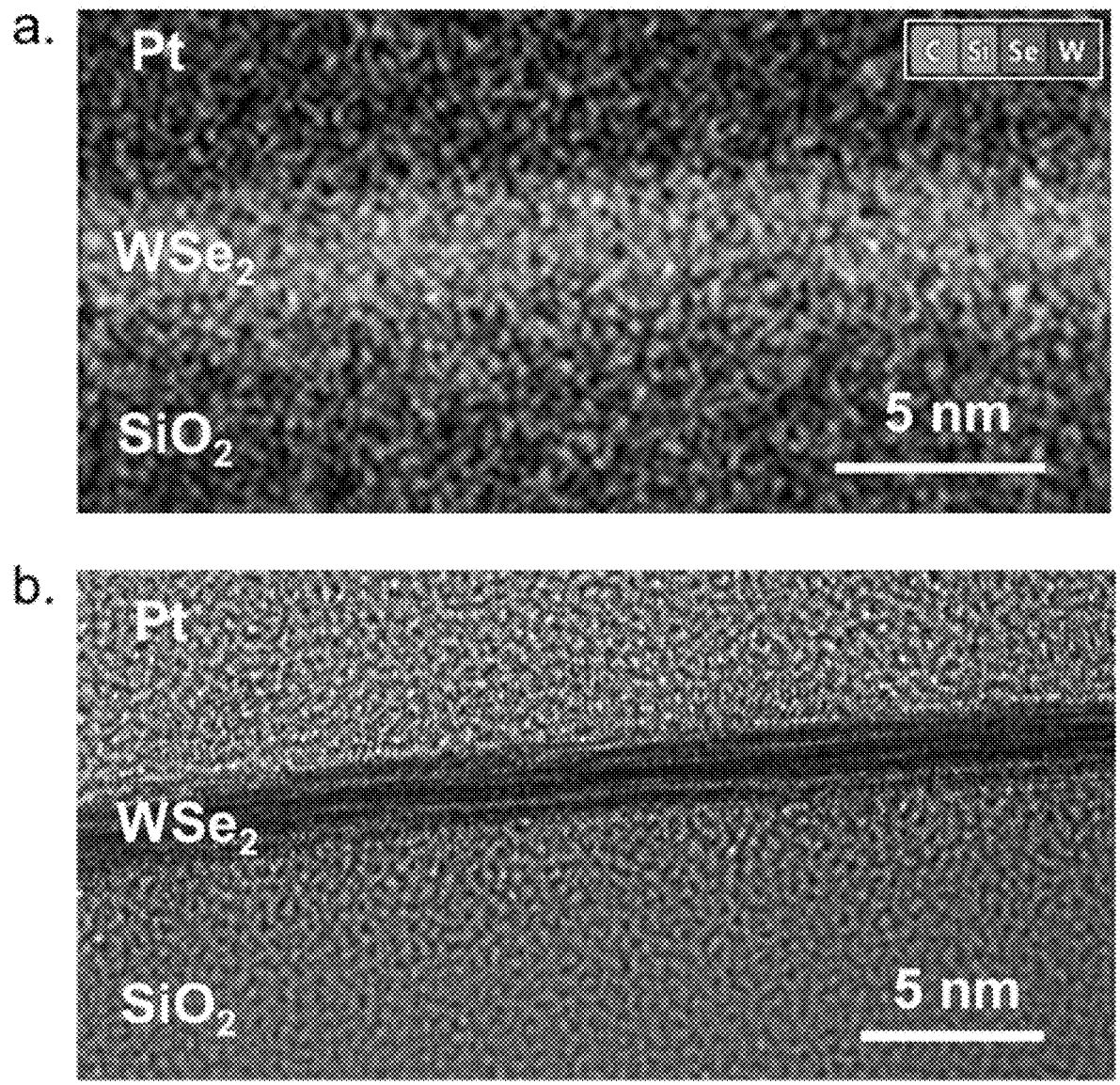
FIG. 6 shows the results of (a) high-resolution transmission electron microscope (HRTEM) and (b) energy dispersive X-ray spectroscopy (EDS) of the $SiO_2/WSe_2/Pt$ cross-sectional layer of TMD flake synthesized by the salt-assisted thermal CVD method according to Manufacturing Example 1 of the present invention.

FIG. 6 shows the results of (a) high-resolution transmission electron microscope (HRTEM) and (b) energy dispersive X-ray spectroscopy (EDS) of the SiO$_2$/WSe$_2$/Pt cross-sectional layer of TMD flake synthesized by the salt-assisted thermal CVD method according to Manufacturing Example 1 of the present invention.

Referring to FIG. 6, it can be confirmed that the thickness of WSe$_2$ grown on the SiO$_2$ substrate formed by the salt-assisted thermal CVD method of the present invention was about 3 nm, and also that the thin film was formed of a two-dimensional material as a uniform and flat thin film, and no impurities were detected in the TEM-EDS element mapping analysis.

Figure 7:
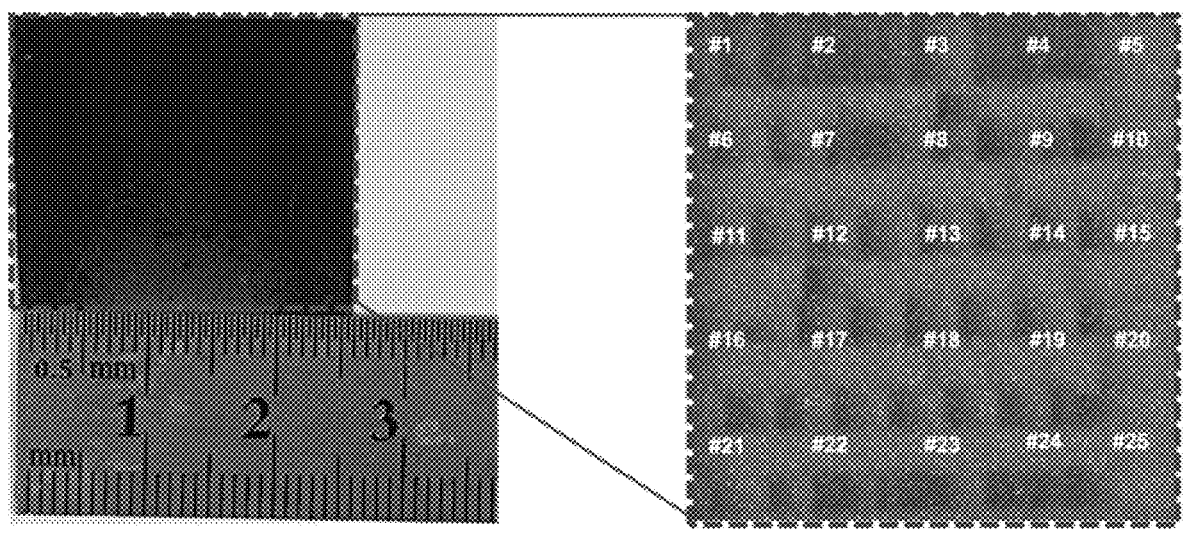
FIG. 7 shows an optical photograph of TMD flake synthesized using a 2×2 inch substrate by the salt-assisted thermal CVD method according to Manufacturing Example 1 of the present invention and 25 sites used for PL spectroscopy measurement.
Figure 8:
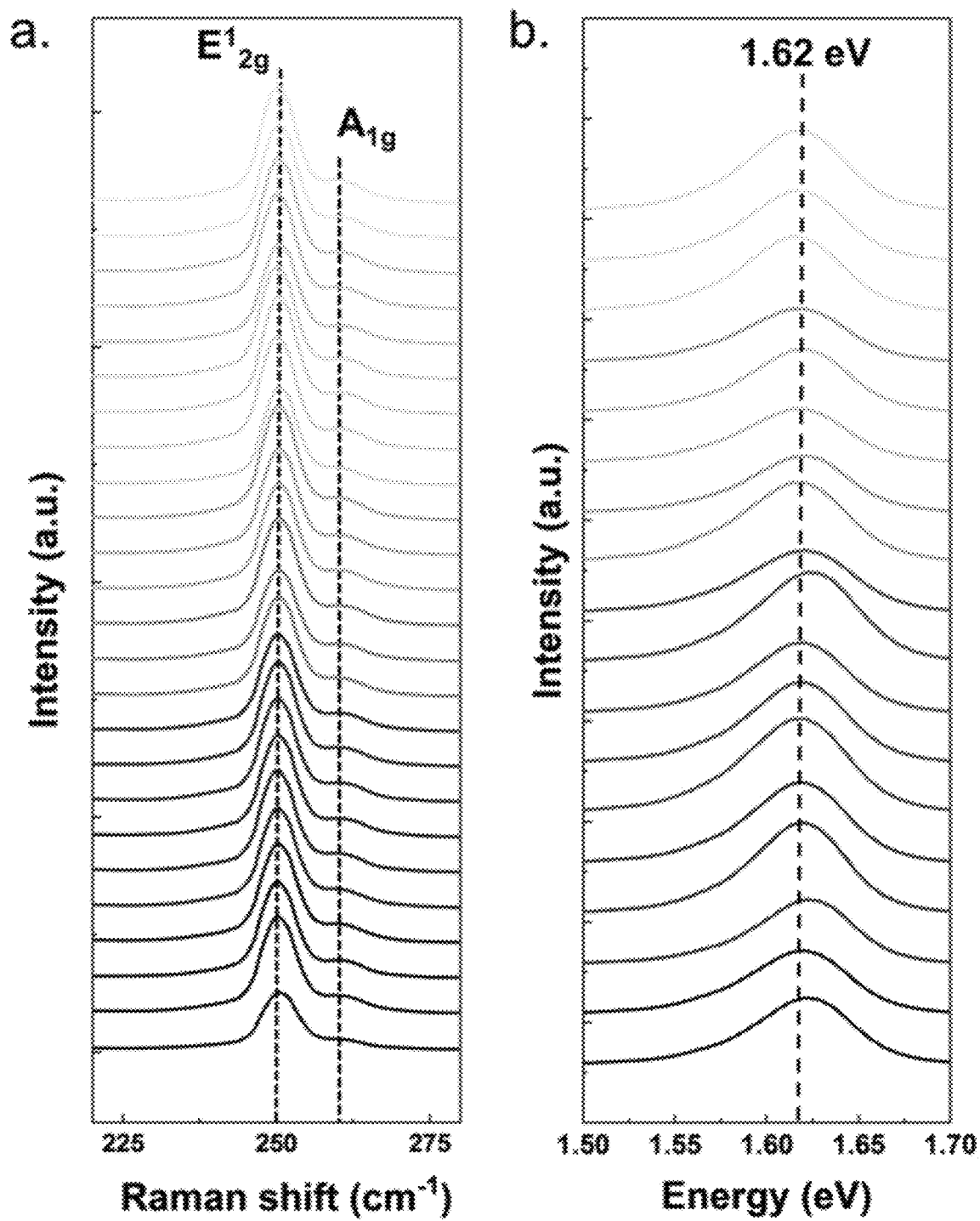
FIG. 8 shows the results of (a) Raman analysis corresponding to the in-plane vibrational mode ($E^1_{2g}$) and out-of-plane vibrational mode ($A_{1g}$) collected at about 250 cm$^{-1}$ and 260 cm$^{-1}$ from 25 sites within the substrate on which TMD flake was grown using a 2×2 inch substrate by the salt-assisted thermal CVD method according to Manufacturing Example 1, and (b) PL spectroscopy results of the $SiO_2$ substrate (1.62 eV).

FIG. 7 shows an optical photograph of TMD flake synthesized using a 2×2 inch substrate by the salt-assisted thermal CVD method according to Manufacturing Example 1 of the present invention and 25 sites used for PL spectroscopy measurement, and FIG. 8 shows the results of (a) Raman analysis corresponding to the in-plane vibrational mode ($E^1_{2g}$) and out-of-plane vibrational mode ($A_{1g}$) collected at about 250 cm$^{-1}$ and 260 cm$^{-1}$ from 25 sites within the substrate on which TMD flake was grown using a 2×2 inch substrate by the salt-assisted thermal CVD method according to Manufacturing Example 1, and (b) PL spectroscopy results of the SiO$_2$ substrate (1.62 eV).

Referring to FIGS. 7 and 8, it can be confirmed that the TMD flake synthesized by the salt-assisted thermal CVD method exhibited uniform Raman and PL analysis results that were consistent with WSe$_2$ at all 25 sites within the substrate where the TMD flake was grown, confirming that uniform TMD flake with even quality can be grown over the entire surface of the substrate even when using a large area 2×2 inch substrate.

Example 1: LGT Including WSe$_2$ Flake Manufactured Using a Salt-Assisted Thermal CVD Method as a Light Sensing Layer A wafer substrate on which a WSe$_2$ layer manufactured using the method of Manufacturing Example 1 was grown was used as a light sensing layer, and then 50 nm of nickel (Ni) was deposited on the substrate using an electron beam evaporator to form a metal electrode. As a result, a plurality of electrode layers spaced apart from each other and laminated on WSe$_2$ (WSe$_2$/Ni interface) were manufactured to manufacture an LGT including a WSe$_2$ flake manufactured using a salt-assisted thermal CVD method as a light sensing layer.

Experimental Example 2: Measurement of Electrical Characteristics of Transistor

The electrical characteristics of the LGT including a TMD flake synthesized by the salt-assisted thermal CVD method of the present invention as a light sensing layer were measured in a darkroom under ambient conditions using a semiconductor parameter analyzer with a probe system (4200A-SCs, Keithley). Raman spectra were obtained at room temperature under ambient pressure using a Raman spectrometer (DXR2xi, Thermo Fisher Scientific) with a 532 nm laser and an incident laser power of 6.1 mW in the range of 50 to 3500 cm$^1$. The topography of the LGT and Kelvin probe images of 30 m×30 m areas were collected using an AFM (MFD-3D Origin AFM, Oxford Instruments) in non-contact and scanning Kelvin probe microscopy (SKPM) modes. Fourier transform infrared (FT-IR) spectra were obtained at room temperature using an FT-IR spectrometer (Thermo Fisher (IS50)). An XPS analysis was performed using an XPS Thermo Fisher Nexsa G2 surface analysis system. PL spectroscopy was performed at room temperature using a PL (Nanobase) instrument, and cross-sectional height profile was measured using a TEM FEI Themis-Z instrument.

Figure 9:
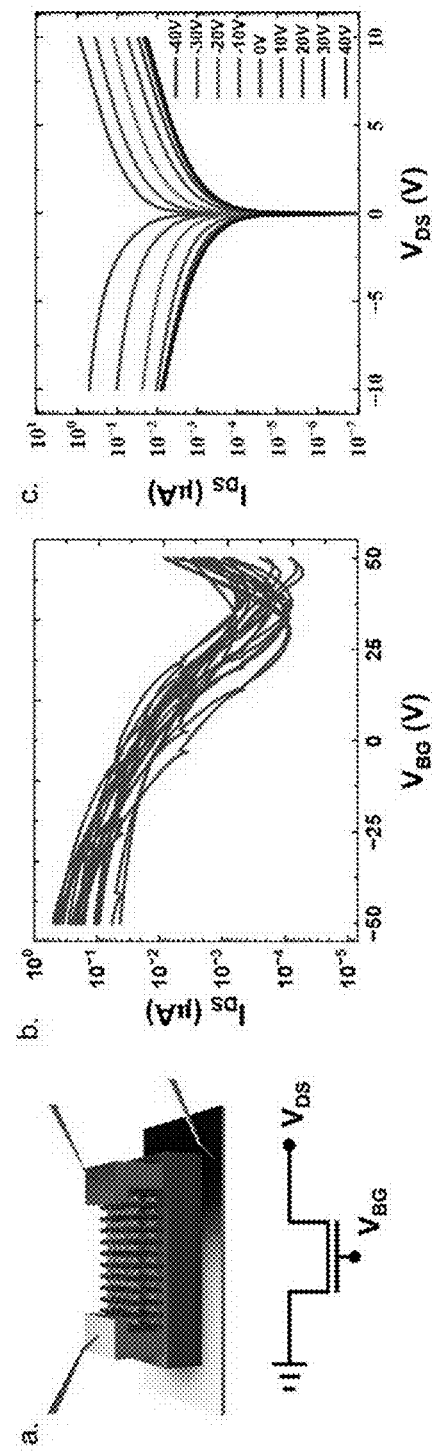
FIG. 9 shows (a) a schematic diagram and a circuit diagram of an LGT including the TMD flake synthesized by the salt-assisted thermal CVD method according to Example 1 of the present invention as a light sensing layer when the LGT is used as a general back-gate TMD field-effect transistor (back-gated $WSe_2$ FET), (b) p-type transmission characteristics measured by $V_{BG}$ (−50 V to +50 V) sweeping at a constant $V_DS$ (1 V), and (c) output I-V results swept from −10 V to +10 V at different gate biases.

FIG. 9 shows (a) a schematic diagram and a circuit diagram of an LGT including the TMD flake synthesized by the salt-assisted thermal CVD method according to Example 1 of the present invention as a light sensing layer when the LGT is used as a general back-gate TMD field-effect transistor (back-gated WSe$_2$ FET), (b) p-type transmission characteristics measured by $V_{BG}$ (−50 V to +50 V) sweeping at a constant $V_{DS}$ (1 V), and (c) output I-V results swept from −10 V to +10 V at different gate biases.

Figure 10:
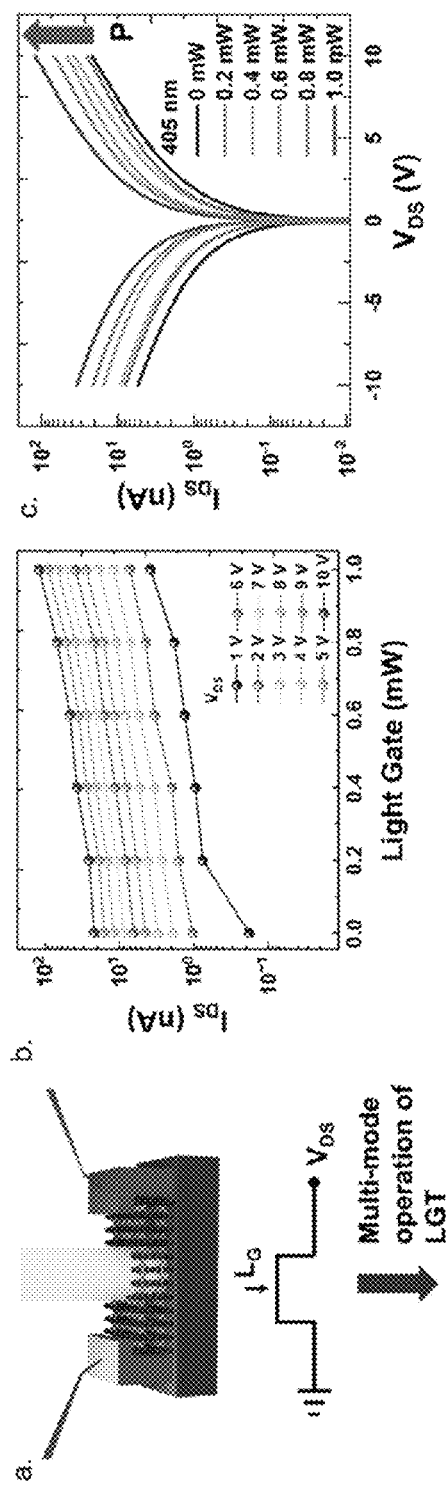
FIG. 10 shows a schematic diagram and a circuit diagram of an LGT including the TMD flake synthesized by a salt-assisted thermal CVD method according to Example 1 of the present invention as a light sensing layer, in a state where optical power of a wavelength of 405 nm is applied, (b) transmission characteristics under different levels of light-gating power, and (c) output I-V results under different levels of light-gating power in the range of 0.2 to 1.0 mW under a $V_{DS}$ sweep from −10 V to +10 V under a threshold optical power.

FIG. 10 shows a schematic diagram and a circuit diagram of an LGT including the TMD flake synthesized by a salt-assisted thermal CVD method according to Example 1 of the present invention as a light sensing layer, in a state where optical power of a wavelength of 405 nm is applied, (b) transmission characteristics under different levels of light-gating power, and (c) output I-V results under different levels of light-gating power in the range of 0.2 to 1.0 mW under a $V_{DS}$ sweep from −10 V to +10 V under a threshold optical power.

Referring to FIGS. 9 and 10, it can be confirmed that the LGT including the TMD flake synthesized by the salt-assisted thermal CVD method according to Example 1 of the present invention as a light sensing layer may be driven in both FET and LGT modes during electrical gating and light gating. Referring to FIG. 9, p-type transmission characteristics were measured in a WSe$_2$-based back-gate transistor device using a back-gate sweep $V_{BG}$ from −50 V to +50 V at a constant $V_{DS}$=1 V. The FET device exhibited hole mobility of p-type dominant driving characteristics with a top gate voltage of 92.35 cm$^2$V$^{-1}$s$^{-1}$ and ambipolar behavior. Referring to FIG. 10, the same device may be light-gated by optical power as well. As the light gate is illuminated, photo-generated charge carriers can modulate the conductivity of the light-sensitive region, which in turn modulates the electrical behavior of the transistor. The output characteristics of the light-gated transistor may be controlled by the output current or voltage and the input light intensity, wavelength, or other related parameters. The light-gated transistor exhibits high sensitivity and fast response time, and light power of different outputs may provide multiple 'ON' states. Therefore, the transistor of the present invention can be used as an integrated transistor capable of driving both electrical signal processing and light sensing.

Figure 11:
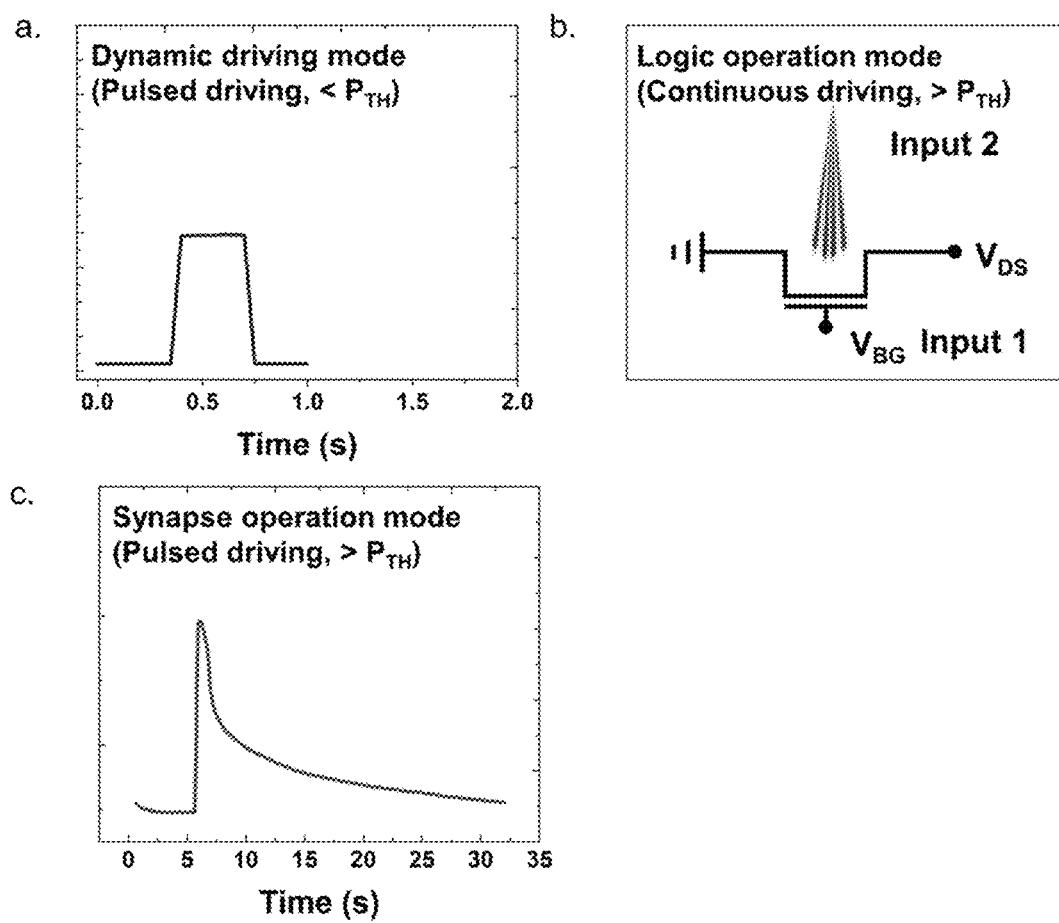
FIG. 11 shows a diagram illustrating (a) dynamic driving mode under pulse modulation of light irradiation under a threshold optical power, (b) single device-based logic operation with simultaneous input of electrical gating and light gating, and (c) brain-inspired synaptic function mode for a threshold optical power of an LGT including the TMD flake synthesized by the salt-assisted thermal CVD method according to Example 1 of the present invention as a light sensing layer.

FIG. 11 shows a diagram illustrating (a) dynamic driving mode under pulse modulation of light irradiation under a threshold optical power, (b) single device-based logic operation with simultaneous input of electrical gating and light gating, and (c) brain-inspired synaptic function mode for a threshold optical power of an LGT including the TMD flake synthesized by the salt-assisted thermal CVD method according to Example 1 of the present invention as a light sensing layer.

Referring to FIG. 11, an LGT including a TMD flake synthesized by the salt-assisted thermal CVD method according to Example 1 of the present invention as a light sensing layer may exhibit the ability to induce optical response and postsynaptic current generation. Synaptic weights in an LGT device are intricately linked to various parameters including the power, duration, and frequency of the applied stimulus. Regarding power, for any transmission between different states to occur, it is important to exceed a certain threshold energy barrier, and this is a phenomenon similar to that occurs in biological neurons where the signal intensity must exceed a certain threshold to enable the formation of synapses between successive axons. Similarly, in solid-state synaptic devices, regardless of whether the nature of a stimulus is electrical, optical, or chemical, an intensity that exceeds the threshold must be exhibited for effective operation and state transition. In the absence of an optical stimulus, the device remains unresponsive and does not produce any observable output. However, when a relatively low intensity optical stimulus that is lower than the threshold is applied, it triggers a carrier-based optical response, which is detectable but insufficient to establish significant synaptic weights. On the other hand, when the stimulus intensity exceeds a threshold barrier (denoted by PTH), a transition occurs. The general optical response evolves into a synaptic response characterized by non-zero synaptic weights. This transition means the capabilities of the device to store and process information, similar to a short-term memory. In particular, when the laser power level varies within the range of 0.2 to 0.8 mW (see again FIG. 10), the LGT device exhibits zero synaptic weights, thereby exhibiting behavior consistent with sensory perception. However, when the laser stimulus intensity exceeds 1 mW, the device undergoes a transition from sensory behavior to a short-term memory-like state, with non-zero synaptic weights. These functional changes could have applications as both photodetectors and electronic synaptic devices, particularly in the context of sensory memory systems, where LGTs may exhibit excellent information processing and storage performance.

Figure 12:
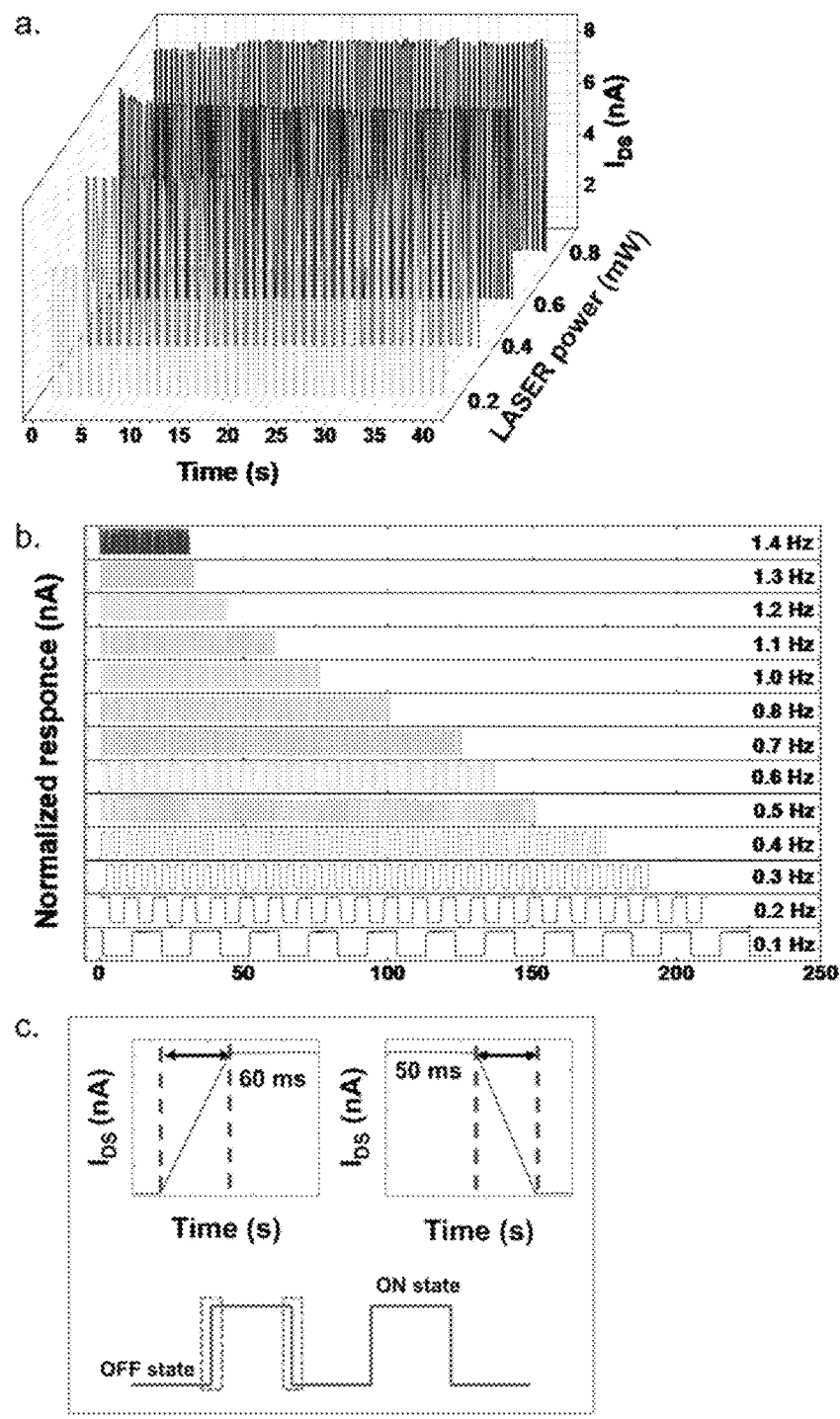
FIG. 12 shows the results of (a) dynamic optical response generated from a laser source having a wavelength of 405 nm and power of 0.2 to 0.8 mW/cm$^2$, (b) optical response over an operating frequency spectrum in a range from 1.4 Hz to 0.1 Hz, and (c) response characteristics of an LGT including the TMD flake synthesized by the salt-assisted thermal CVD method according to Example 1 of the present invention as a light sensing layer.

FIG. 12 shows the results of (a) dynamic optical response generated from a laser source having a wavelength of 405 nm and power of 0.2 to 0.8 mW/cm², (b) optical response over an operating frequency spectrum in a range from 1.4 Hz to 0.1 Hz, and (c) response characteristics of an LGT including the TMD flake synthesized by the salt-assisted thermal CVD method according to Example 1 of the present invention as a light sensing layer.

Referring to FIG. 12, the light-induced dynamic driving characteristics of the WSe$_2$ LGT device were evaluated in terms of the dynamic optical response under dark conditions and laser (405 nm) illumination. FIG. 12A shows the temporal optical response at zero gate voltage over a range of light source power from 0.2 mW to 0.8 mW. The measured response remained consistent and reproducible for multiple consecutive ON/OFF cycles at each power level. This stability and repeatability represent the robust performance of the LGT dynamic response, further emphasizing its high sensitivity. In addition, the LGT device exhibited excellent optical response over a wide operating frequency spectrum from a fast frequency of 1.4 Hz to a low frequency of 0.1 Hz. The remarkable photodetection performance observed at various power levels and frequencies implies that the device is suitable for various optical communication devices. The rise time of each optical signal frequency was about 60 ms, while the decay time was about 50 ms, indicating fast response characteristics. These results demonstrates the outstanding performance of the LGT-based photodetector, which features high sensitivity, cycling stability, and applicability over a wide range of operating frequencies. Due to these properties, the device may be applied as a variety of optical communication and sensing devices.

Figure 13:
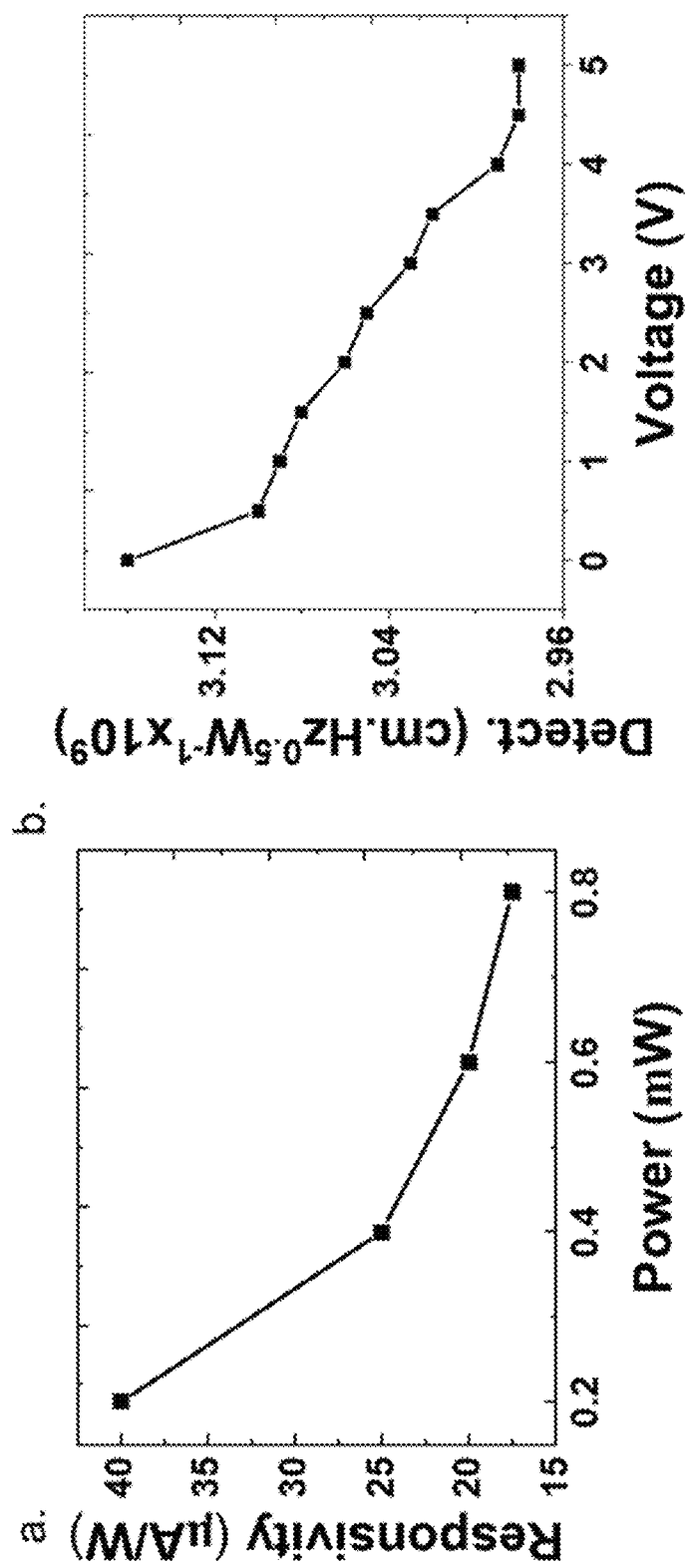
FIG. 13 shows the results of an analysis of (a) device responsiveness at different power levels of a laser and (b) specific detectability for each bias across a channel of an LGT including the TMD flake synthesized by the salt-assisted thermal CVD method according to Example 1 of the present invention as a light sensing layer.

FIG. 13 shows the results of an analysis of (a) device responsiveness at different power levels of a laser and (b) specific detectability for each bias across a channel of an LGT including the TMD flake synthesized by the salt-assisted thermal CVD method according to Example 1 of the present invention as a light sensing layer.

Referring to FIG. 13, the responsivity (R) is an important parameter that quantifies the sensitivity of the detector to the incident light power. It is precisely calculated as the ratio of the photocurrent (Iph) generated as a result of the photons absorbed within the detector to the amount of light power (PO) colliding with the active surface area of the detector. This parameter is a fundamental measure that provides valuable insight into the performance characteristics of the photodetector that converts the incoming photons into current. The responsivity (R) and the detectivity (D*) are parameters for evaluating the performance of the photodetector of the LGT device and may be expressed by the following Equations 1 and 2.

$$R(\lambda) = EQE\frac{\lambda q}{hc} = \frac{I_{ph}}{P_o} \quad \text{[Equation 1]}$$

$$D^* = \frac{R(\lambda)}{\sqrt{2qJ_{dark}}}\left[cmHz\frac{1}{2}W^{-1}\right] \quad \text{[Equation 2]}$$

Here, λ is the wavelength, q is the charge of the electron, h is Planck's constant, c is the speed of light in vacuum, D* is the detectivity, and $J_{dark}$ is the dark current density.

The LGT of the present invention exhibits the highest responsivity and detectivity, especially when using a 0.2 mW optical power source, and at that time, the responsivity was about 40 µA/W and the detectivity was about 3.16×10$^9$ cmHz$^{0.5}$W$^{-1}$. However, these performance metrics are found to decrease as the optical power increases beyond this threshold. This decrease in responsivity and detectivity suggest the presence of specific trap states within the light-gating device. This deviation from the ideal behavior indicates the presence of non-ideal characteristics, such as trap states and limitations in charge carrier extraction in the light-gated device.

Figure 14:
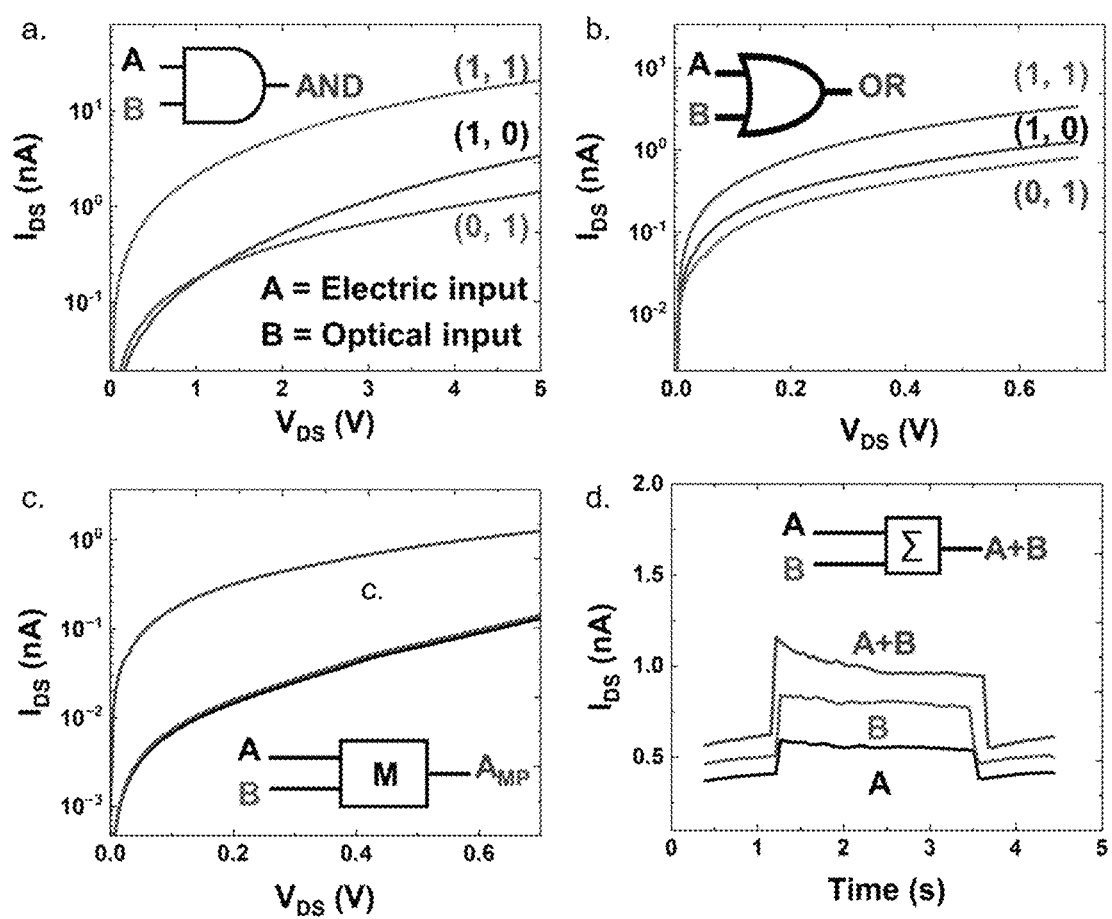
FIG. 14 shows an analysis of transistor logic using an LGT including the TMD flake synthesized by the salt-assisted thermal CVD method according to Example 1 of the present invention as a light sensing layer.

FIG. 14 shows an analysis of transistor logic using an LGT including the TMD flake synthesized by the salt-assisted thermal CVD method according to Example 1 of the present invention as a light sensing layer.

Referring to FIG. 14A, a series of inputs using a light gate with power of 5 mW as IN-1 and an electric gate with +5 V as IN-2 were demonstrated and the AND logic was output. Referring to FIG. 14B, when a series output was provided using an optical gate with power of 5 mW as IN-1 and an electric gate with −5 V as IN-2, a logic was demonstrated and the OR logic was output. Referring to FIGS. 14C and 14D, the LGT and the amplifier response may output a summation operation in which the response of single A and signal B is summed to generate A+B. Here, a laser light gate with power of 5 mW was used as IN-A and a LED gate with power of 1 mW was used as IN-B. The input data is shown in black/blue, and the output logic functions of the device are shown in red.

Figure 15:
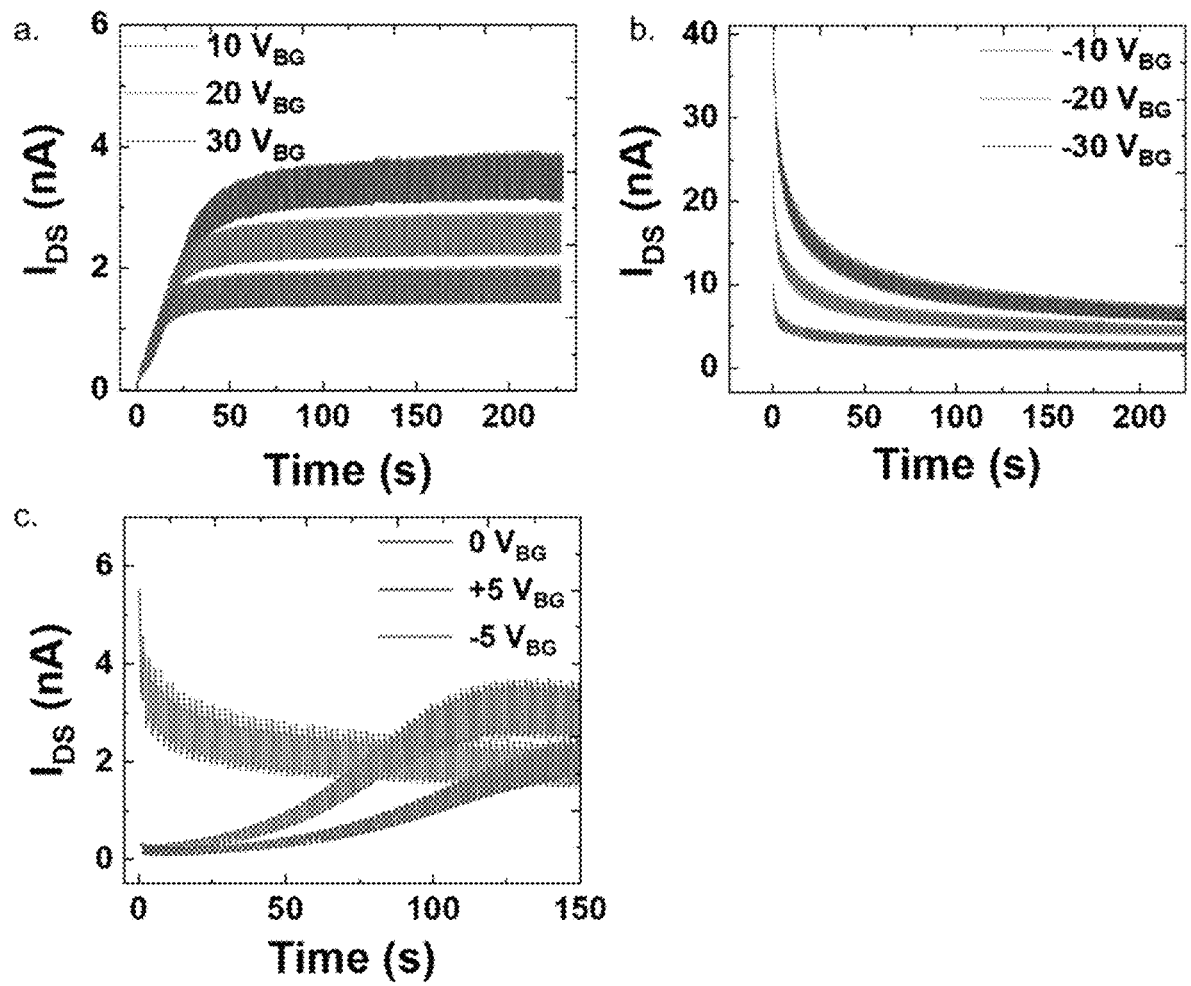
FIG. 15 shows (a) the excitatory postsynaptic behavior according to the number of pulses under a positive bias of a back-gate electric field, (b) the inhibitory postsynaptic behavior according to the number of pulses under a negative bias of a back-gate electric field, and (c) the optimized excitatory postsynaptic current (EPSC) and inhibitory postsynaptic current (IPSC) characteristics when a gated bias field is small or absent for efficient power consumption, of an LGT including the TMD flake synthesized by the salt-assisted thermal CVD method according to Example 1 of the present invention as a light sensing layer.

FIG. 15 shows (a) the excitatory postsynaptic behavior according to the number of pulses under a positive bias of a back-gate electric field, (b) the inhibitory postsynaptic behavior according to the number of pulses under a negative bias of a back-gate electric field, and (c) the optimized excitatory postsynaptic current (EPSC) and inhibitory postsynaptic current (IPSC) characteristics when a gated bias field is small or absent for efficient power consumption, of an LGT including the TMD flake synthesized by the salt-assisted thermal CVD method according to Example 1 of the present invention as a light sensing layer.

Referring to FIGS. 15A to 15C, it can be confirmed that the synaptic characteristics of the LGT were observed when the laser gating power exceeded the threshold power by applying a 405 nm wavelength laser stimulus with a power of 1 mW operating at a source frequency of 1 Hz. The source-drain voltage ($V_{DS}$) was maintained at a constant value of 1.0 V, while the back-gate voltage ($V_{BG}$) was varied over 10 V, 20 V, and 30 V for the EPSC. For the IPSC, $V_{BG}$ was adjusted to −10 V, −20 V, and −30 V. Due to the p-type semiconductor characteristics of the $WSe_2$-based light sensing layer, the gating weight transmission intensity decreases when the back-gate potential increases. In the LGT including a TMD flake according to the present invention as a light sensing layer, it can be confirmed that EPSC and IPSC behaviors were gradually progressed according to pulse stimulus-based learning (FIG. 15A) and forgetting (FIG. 15B) dynamics, which are affected by both the polarity and magnitude of the back-gate field. In particular, considering that the gating responses for both EPSC and IPSC were saturated earlier as the back-gate field became larger, the LGT including a TMD flake according to the present invention as a light sensing layer demonstrated the ability to exhibit learning behavior even in the absence of the back-gate field, and may be adjusted to exhibit forgetting behavior with a very small negative polarity applied to $V_{BG}$, such as $V_{BG}$=−5 V, as shown in FIG. 15C. At $V_{BG}$=0 V, a wide range of conductance states was observed, and the range extended until saturation was reached. These results may show that the transistor can be operated efficiently at lower power levels and driven by synaptic behaviors with reduced energy consumption.

Figure 16:
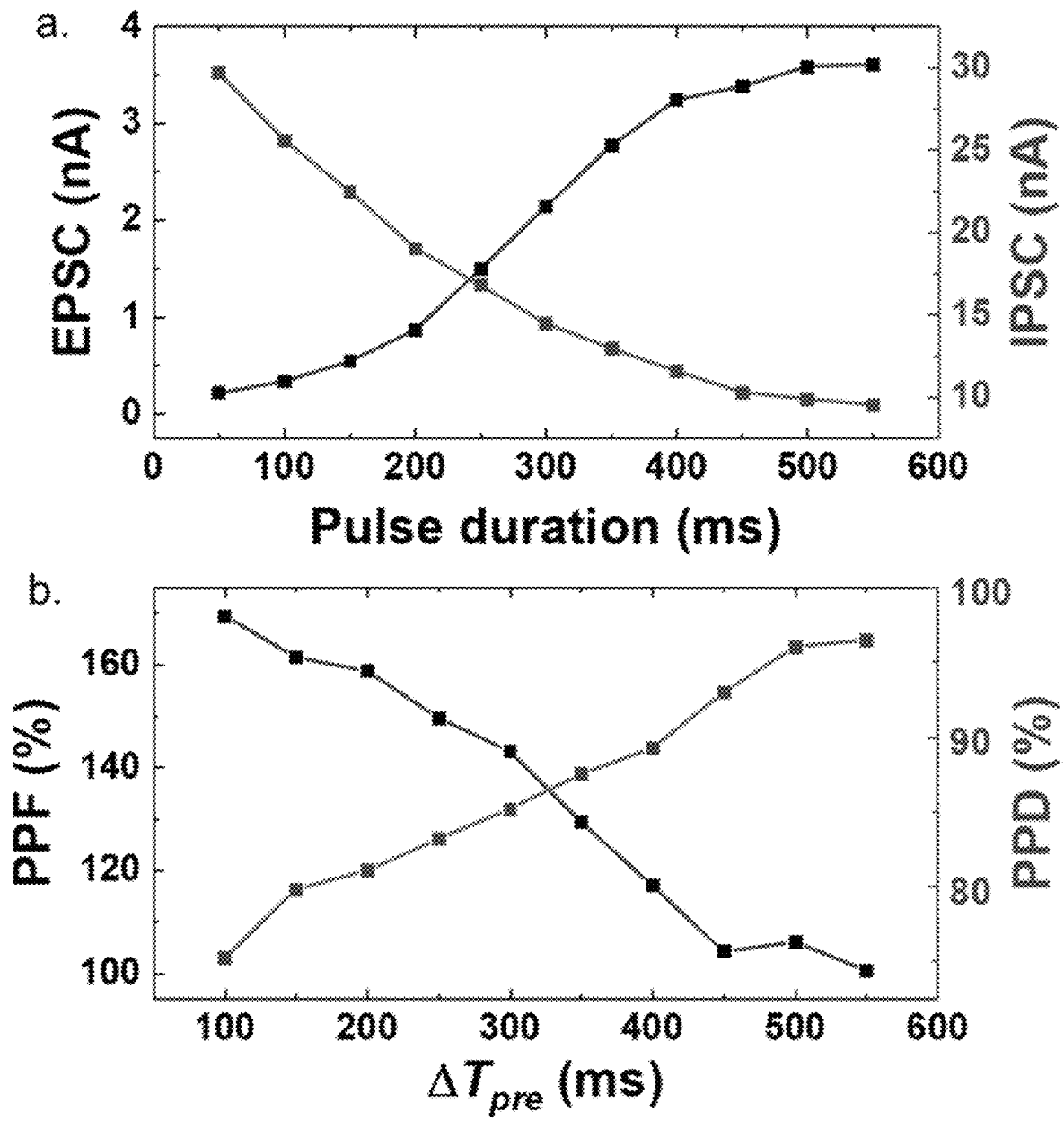
FIG. 16 shows (a) the EPSC and IPSC characteristics according to pulse duration of an LGT including the TMD flake synthesized by the salt-assisted thermal CVD method according to Example 1 of the present invention as a light sensing layer, and (b) the paired pulse facilitation (PPF) and Paired pulse depression (PPD) characteristics of the device.
Figure 17:
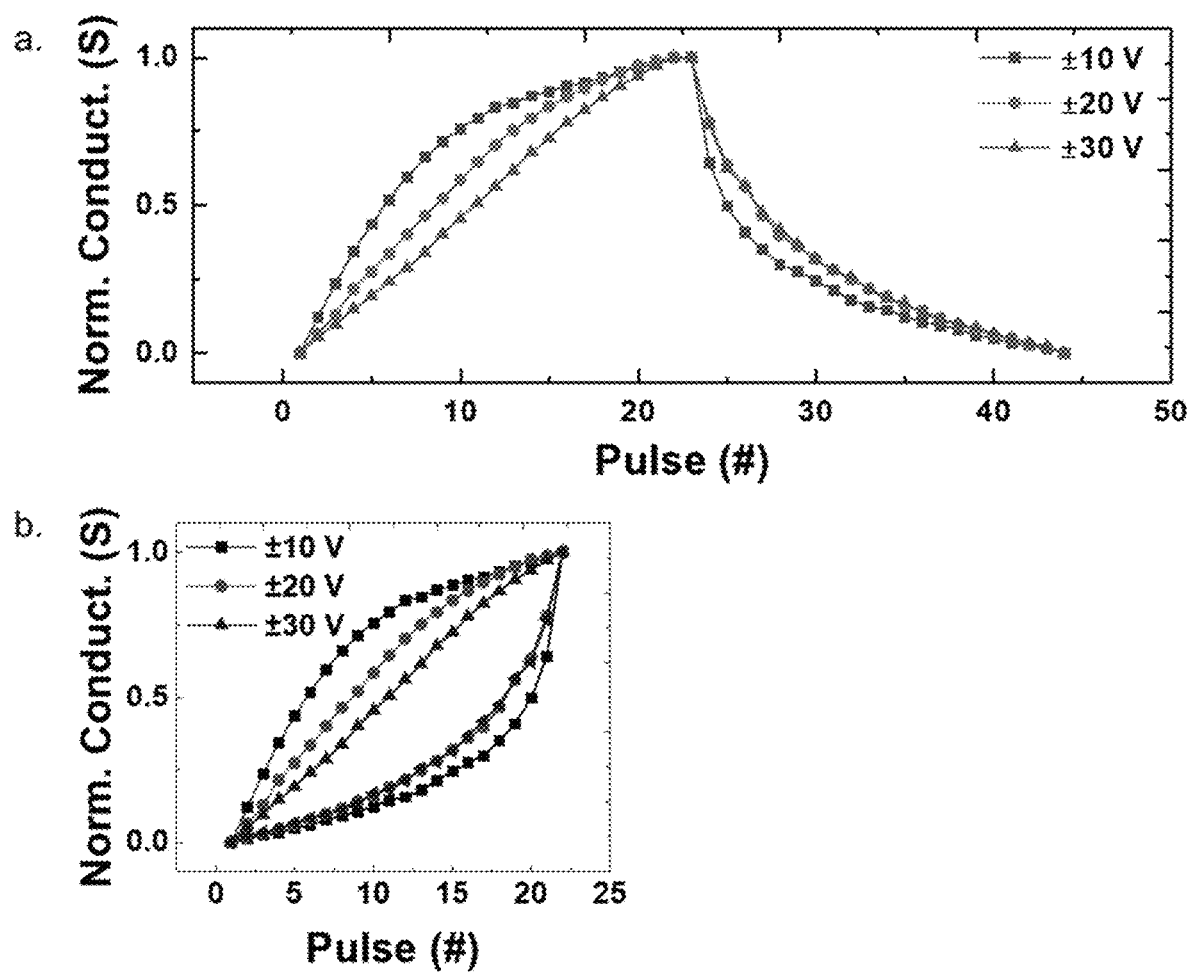
FIG. 17 shows (a) the learning (potentiation) and forgetting (depression) results under various gate electric fields normalized using an optimized laser pulse, and (b) the normalized learning (potentiation) and forgetting (depression) results for nonlinearity analysis, of an LGT including the TMD flake synthesized by the salt-assisted thermal CVD method according to Example 1 of the present invention as a light sensing layer.

FIG. 16 shows (a) the EPSC and IPSC characteristics according to pulse duration of an LGT including the TMD flake synthesized by the salt-assisted thermal CVD method according to Example 1 of the present invention as a light sensing layer, and (b) the paired pulse facilitation (PPF) and Paired pulse depression (PPD) characteristics of the device, and FIG. 17 shows (a) the learning (potentiation) and forgetting (depression) results under various gate electric fields normalized using an optimized laser pulse, and (b) the normalized learning (potentiation) and forgetting (depression) results for nonlinearity analysis, of an LGT including the TMD flake synthesized by the salt-assisted thermal CVD method according to Example 1 of the present invention as a light sensing layer.

Referring to FIGS. 16 and 17, the EPSC and IPSC induced by pulsed laser stimulation were performed at a constant back gate voltage ($V_{BG}$) of 10 V and −10 V, respectively, and it can be confirmed that the EPSC and IPSC responses showed a gradual saturation trend as the laser pulse duration increased from 50 ms to 550 ms. This operation is similar to the PPF and PPD mechanisms that are observable in biological neurons, which play an important role in information processing in neural networks. In particular, it can be confirmed that the EPSC induced in response to the second laser pulse was greater than that in response to the first pulse, and conversely, the IPSC decreased in response to the second laser pulse compared to the first laser pulse. These results are consistent with the characteristics known as synaptic responses in biological systems, and may be understood as results indicating the suitability for synaptic properties and their functions.

According to the above-described present invention, the TMD flake manufactured by the molten salt-assisted thermal CVD method according to a preferred embodiment of the present invention can be uniformly and evenly grown on a large-area substrate with a size of several to several hundred micrometers in scale, and an LGT using this as a light sensing layer can perform logical operations of AND, OR, and summation operations in response to light stimulation and enable a low-power synaptic operation response.

The effects of the present invention are not limited to those mentioned above, and other effects that can be clearly understood by those skilled in the art from the description throughout the specification but are not explicitly mentioned are also included.

Although the embodiments of the present invention have been described with reference to the attached drawings, those skilled in the art will understand that the present invention can be implemented in other specific forms without changing the technical idea or essential features thereof. Therefore, it should be understood that the above-described embodiments are illustrative in all respects and not restrictive.

REFERENCE NUMERALS

100: light-gated transistor
110: substrate
111: silicon
112: insulating layer
120: light sensing layer
130: electrode

What is claimed is:

1. A method of manufacturing a light-gated transistor, the method comprising:
preparing a first heating furnace and a second heating furnace spaced apart from each other;
positioning a first precursor including a chalcogen material in the first heating furnace, a second precursor prepared by mixing tungsten trioxide ($WO_3$) and sodium chloride (NaCl) in the second heating furnace, and a substrate to be adjacent to the second precursor;
forming a light sensing layer including at least one transition metal dichalcogenide (TMD) flake on top of the substrate by heating the first heating furnace and the second heating furnace to different temperatures, respectively, and performing molten salt-assisted thermal chemical vapor deposition;
depositing at least two electrodes to form at least two junctions in the light sensing layer; and
forming another electrode under the substrate,
wherein a mixing ratio of the $WO_3$ and the NaCl is 5:1 to 7:1 by weight, and
wherein the light-gated transistor is a logic element that performs an AND or OR logical operation by deriving current characteristics according to a combination of optical power applied from an outside in a form of a pulse to the light sensing layer and a positive or negative voltage applied to the another electrode.

2. The method according to claim 1,
wherein in the forming of the light sensing layer, the temperature of the first heating furnace is higher than or equal to 500° C. and lower than 700° C., and the temperature of the second heating furnace is higher than or equal to 700° C. and lower than 900° C.

3. The method of according to claim 1,
wherein the at least one TMD flake has a layered form of a single layer or two or more layers.

4. The method according to claim 1,
wherein an average horizontal length of the at least one TMD flake included in the light sensing layer is 10 to 100 m.

5. The method according to claim 1,
wherein the at least two electrodes include a metal or a metal compound, and the metal or the metal compound includes a metal element including at least one selected from Ti, Ni, Au, Ag, and a combination thereof.

\* \* \* \* \*